United States Patent [19]

Zommer

[11] Patent Number: 5,034,796
[45] Date of Patent: Jul. 23, 1991

[54] SIMPLIFIED CURRENT SENSING STRUCTURE FOR MOS POWER DEVICES

[75] Inventor: Nathan Zommer, Los Altos, Calif.
[73] Assignee: IXYS Corporation, San Jose, Calif.
[21] Appl. No.: 362,805
[22] Filed: Jun. 7, 1989
[51] Int. Cl.⁵ ............................................. H01L 27/02
[52] U.S. Cl. ..................................... 357/41; 357/25; 357/28; 357/23.4; 357/38; 307/303.1
[58] Field of Search ...................... 357/41, 46, 42, 25, 357/26, 28, 40, 23.4, 38, 23.1; 307/303.1

[56] References Cited

U.S. PATENT DOCUMENTS

| | | | |
|---|---|---|---|
| 4,136,354 | 1/1979 | Dobkin | 357/28 |
| 4,158,807 | 6/1979 | Senturia | 357/25 |
| 4,783,690 | 11/1988 | Walden et al. | 357/23.1 |
| 4,818,895 | 4/1989 | Kaufman | 357/25 |
| 4,908,682 | 3/1990 | Takahashi | 357/23.4 |

FOREIGN PATENT DOCUMENTS

| | | | |
|---|---|---|---|
| 56-35963 | 10/1981 | Japan | 357/28 |
| 61-44884 | 7/1986 | Japan | 357/28 |

OTHER PUBLICATIONS

Power Conversion and Intelligent Motion Magazine, Jul. 1987, pp. 76–83, "Current Sensing Hex Sense SMPS Designs and Lower Losses", by Sean Young.

Zommer, et al., "Power Current Mirror Devices and Their Applications", PCI '86 Proceedings, Jun. 1986, pp. 275–283.

Primary Examiner—Rolf Hille
Assistant Examiner—Steven Loke
Attorney, Agent, or Firm—Townsend and Townsend

[57] ABSTRACT

In a DMOS power device, a current sensing apparatus comprises bonding pads arranged in specific locations with at least one current sense pad having active cells thereon and a source pad which is separated from the current sense pad. The configuration of cells provides that sources are tied together by a metal layer, which, due to its specific resistance, forms a resistance path between the source pad and the current sense pad or more specifically between the points of contact of a Kelvin lead of the source pad and the current sense pad. The invention has the advantages that substantially the entire chip area is utilized for conduction of power currents and that internal components form a resistive path for current to voltage conversion.

4 Claims, 3 Drawing Sheets

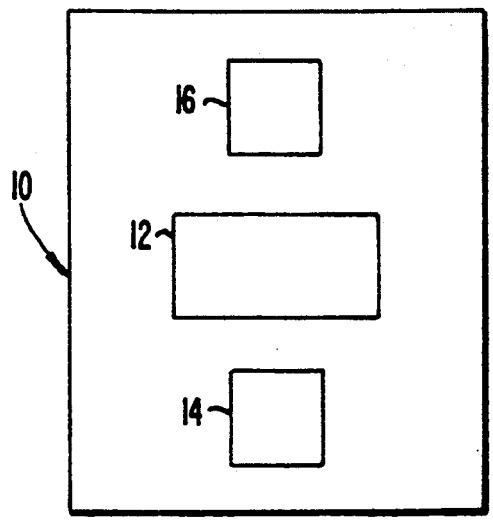
FIG._1.
(PRIOR ART)
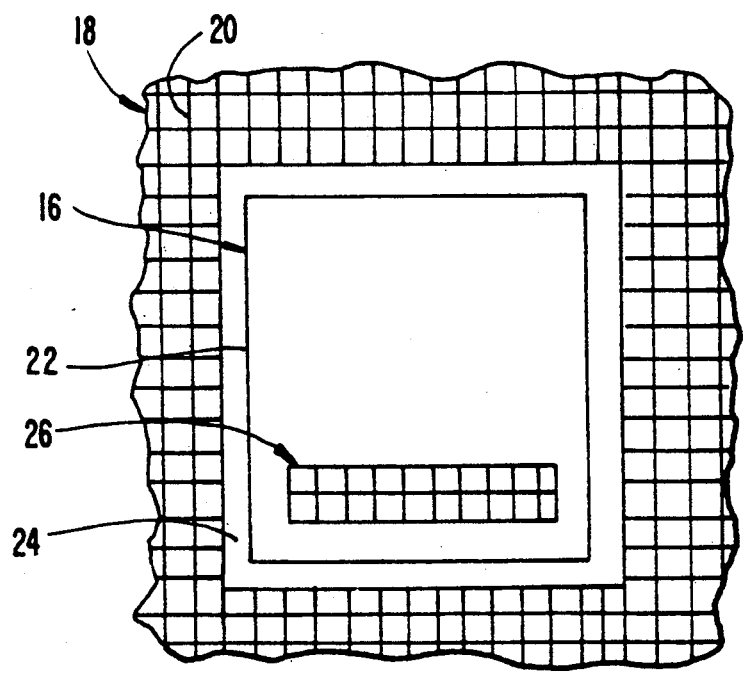
FIG._2.
(PRIOR ART)

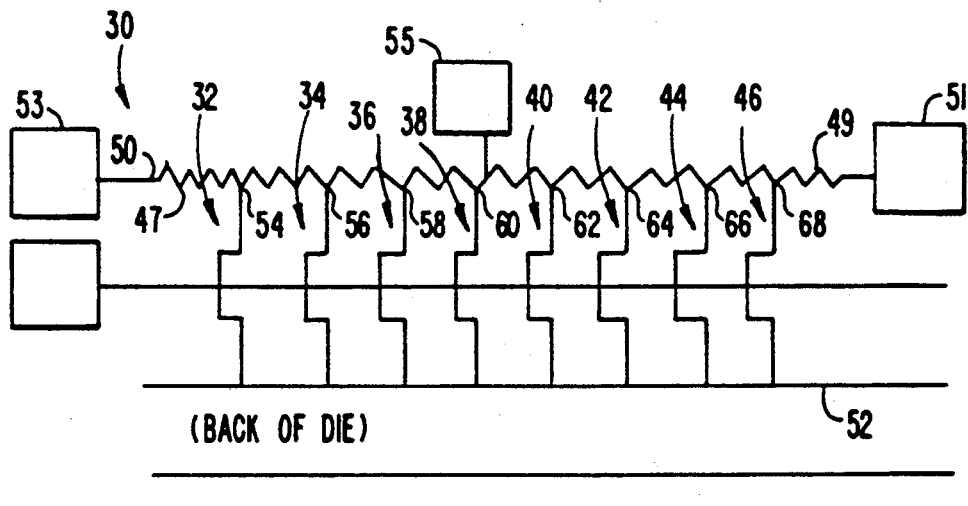
FIG._3.
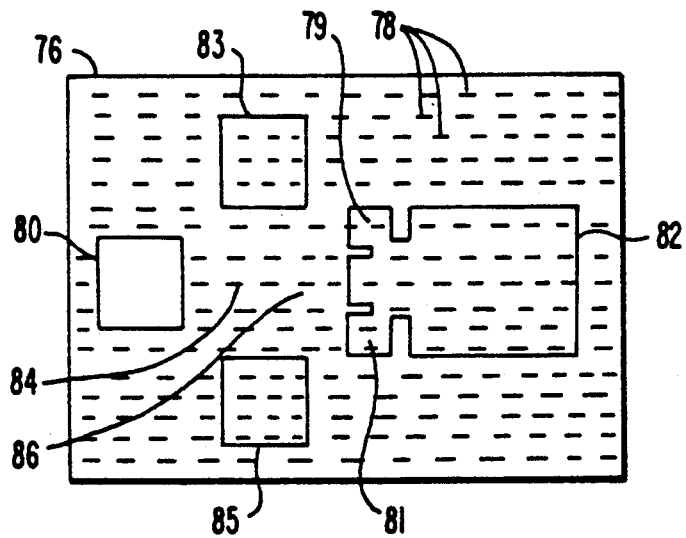
FIG._4.
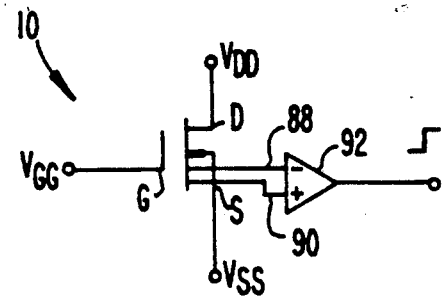
FIG._5.

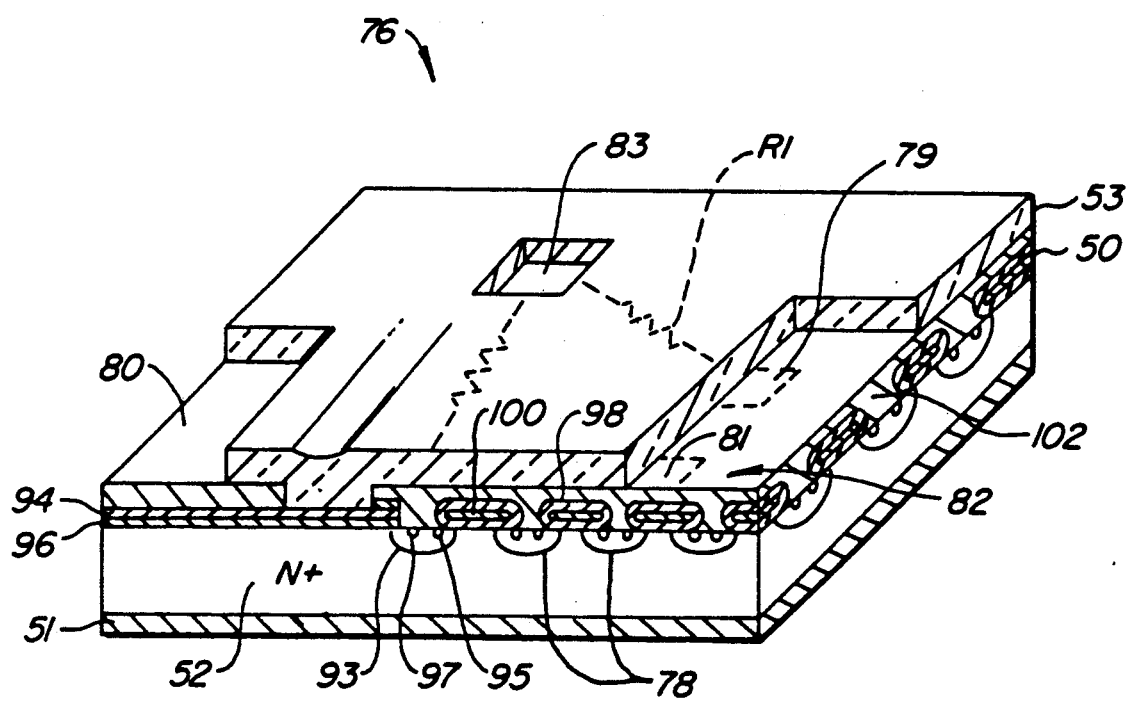
FIG._6.

SIMPLIFIED CURRENT SENSING STRUCTURE FOR MOS POWER DEVICES

BACKGROUND OF THE INVENTION

This invention relates to semiconductor power devices and specifically to DMOS power devices. In DMOS power devices, it is necessary to provide for current sensing of the main current of the main power cells as part of the control scheme for the device. Heretofore, current sensing has been based on current mirror techniques wherein a sense current, which is a fraction of the current through the main power cell, is shunted through a sense resistor, and the voltage drop thereacross is measured to provide an indication of the main current.

In the past, a current mirror structure on a DMOS power device chip has been provided as a separate pad in an isolated section of the die. The prior art current mirror pad is not active in current production and thus is undesired overhead of the chip. Current mirrors also require an output resistor, frequently an external component, in order to convert current signals to voltage signals for sensing.

Aspects of the prior art are explained in connection with FIGS. 1 and 2. FIG. 1, a top view, represents a power MOS chip 10 with a source region 12, a gate region 14 and a current mirror 16. FIG. 2 is an expansion of FIG. 1 around the current mirror 16. The periphery region 18 is the top metal layer for the source 12 including regular active cells 20. The current mirror 16 consists of a group of active cells separated from the source cells, but having the same structure, including a metal pad 22 separated from the top metal in the periphery region 18 of the source by a dielectric gap 24. The current mirror 16 has its active cells 26 disposed within a relatively small proportion of the current mirror region, as is required by the prior art isolation techniques.

It would be desirable to eliminate the use of external components, as well as the devotion of a portion of the chip area to isolation for the current sensor, in order to improve the capacity and reliability of power MOS devices.

The following publication may be helpful in understanding some of the background of the present invention. Zommer et al., "POWER CURRENT MIRROR DEVICES AND THEIR APPLICATIONS," *PCI '86 PROCEEDINGS*. June 1986, pp. 275-283 describes a prior art power MOS transistor structure in general terms in connection with applications thereof.

SUMMARY OF THE INVENTION

In accordance with the invention, in a DMOS power device, a current sensing structure comprises bonding pads arranged in specific locations with at least one current sense pad having active cells thereon and a source pad which is separated from the current sense pad. The configuration of cells provides that sources are tied together by a metal layer, which, due to its specific resistance, forms a resistance path between the source pad and the current sense pad or more specifically between the points of contact of a Kelvin lead of the source pad and the current sense pad. The invention has the advantages that substantially the entire chip area is utilized for conduction of power currents and that internal components form a resistive path for current to voltage conversion. In a specific embodiment, all cells in the power device are coupled in parallel and a surface separation is provided between the Kelvin pad portion of the source pad and the current sense pad. All of the active areas may be occupied by active cells.

BRIEF DESCRIPTION OF THE DRAWINGS

FIG. 1 is a top plan view of a representation of a MOS power device of the prior art.

FIG. 2 is a top plan view of a representation of a segment of the prior art device of FIG. 1.

FIG. 3 is a schematic diagram of a portion of a vertical crosssection of a MOS power device according to the invention.

FIG. 4 is a top plan view of a representation of a MOS power device according to the invention showing a layout of a die.

FIG. 5 is a schematic diagram of one application of the invention.

FIG. 6 is a partial cross-sectional and perspective view in accordance with the invention.

DESCRIPTION OF SPECIFIC EMBODIMENTS

FIG. 3 is a schematic circuit diagram of a vertical crosssection of a power device 30 in accordance with the invention wherein all cells (represented by MOS active devices) 32, 34, 36, 38, 40, 42, 44, 46 are coupled in parallel between a metal layer forming a source 50 and the back side of the die forming the drain 52. The configuration of the cells 32, 34, 36, 38, 40, 42, 44, 46 is such that the specific resistance of the source metal layer 50 forms a resistive path 47 between source pad 53 or its associated Kelvin pad and the current sense pad 51. The source contacts 54, 56, 58, 60, 62, 64, 66, 68 to the cells 32, 34, 36, 38, 40, 42, 44, 46 are all connected to the source metal layer 50. In addition, there may be pads, as represented by pad 55, connected intermediately.

Referring to FIG. 4, there is shown one layout of a die or chip 76 according to the invention. The active area of the die 76 is filled with active cells 78 with the exception of the gate pad area 80. Pad 82 is the site of both the source lead for high current flow and the site of the Kelvin leads at pads 79 and 81. The Kelvin leads are used for providing information on the lateral voltage drop between the source pad 82 and corresponding nearby current sense pads 83 and 85. Other current sense pads (not shown) might alternatively be placed at positions 84 and 86 between pad 82 and pad 80 for measuring voltage drops therebetween.

Referring to FIG. 6, there is shown a cross-sectional perspective view of die 76 on which is formed a MOS power device. Die 76 has a back side electrode layer 51, an N+ drain 52, a top metal layer 50 and glass passivation layer 53. Many individual MOS active cells 78 are disposed in die 76 substantially throughout the power device for conducting current from drain 52 to top metal layer 50. Each MOS cell 78 includes an N-type source 95, an N-type source 97, both disposed within P-type regions 93, and a polysilicon gate layer 100. Gate layer 100 is perforated by source contacts 102 and is insulated from the source layer surrounded by oxide insulation 98.

Top metal layer 50 has a substantially uniform resistivity and defines a source electrode 50 for said active devices. Current sense pads 83 and 85 (not shown) are provided to serve as current sense leads. A source pad 82 serves as a source lead for the MOS power device and as sense leads for Kelvin pads 79 and 81. Kelvin pad 79 is disposed at a first separation from current sense pad 83, across top metal layer 50 such that a resistive path is defined through top metal layer 50 between Kelvin pad 79 and current sense pad 83 such that voltages may be measured indicative of current flow in proportion to current in MOS power device. Lastly, since no MOS cells 78 are disposed under gate pad 80, an oxide layer 96 is disposed on drain 52 with a P-type polysilicon layer 94 disposed between gate pad 80 and oxide layer 96 to serve as a gate in device 76.

The relative locations of the cells to one another is significant. The top metal of the die which forms generally the source metal has a finite resistance. That portion of resistance which is effectively distributed between the location of the first current sense pad 83 and the Kelvin pad 79 is given as resistance R1. That portion of resistance which is effectively distributed between the location of the current sense pad 85 and the location of the Kelvin pad 81 is given as resistance R2. Both of these resistances are typically on the order of 1 to 5 milliohm. Significantly, the resistances across the source pad 82 do not affect current readings because the sensing of currents is between current sense pad 83 and Kelvin pad 79 across resistance R1 and/or between current sense pad 85 and Kelvin pad 81. Current flowing laterally in the metal top layer of the structure due to the relative location of the cells and the flow of current vertically through the cells from the back side to the top metal layer gives rise to a lateral voltage drop on the surface of the die such that sensing of voltage differences between specific locations on the surface of the die can be measured between points on the die, and specifically between the pads of the die. It is similar to sensing voltage drops across fixed resistors but with increased reliability. The spacing between the current sense bond pad and the Kelvin bond pad is chosen preferably to exhibit about 1 milliohm resistance. For each ampere of current, therefore, 1 mV of voltage drop is measurable.

FIG. 5 is a schematic diagram of one application of the invention. Others will be suggested. Therein a power device 10 has a gate G, source S, drain D, a first current sense tap 88 and a second current sense tap 90. The first current sense tap 88 is coupled to a first input of a comparator 92, and the second current sense tap 90 is coupled to a second input of the comparator 92 such that a differential in voltage can be sensed and trigger an appropriate output signal. The first current sense tap 88 may be coupled at first pad 83 and the second current sense tap may be connected at second pad 85 to provide an indication of an imbalance in current flow due to thermal distinction, and the output signal of the comparator may be used to turn off the power device 10. Sensing such asymmetry in current in a power device allows protective measures to be taken which can protect against damage due to asymmetric heating, overcurrent and mechanical defects in packaging.

The invention has now been described with reference to specific embodiments. Other embodiments will be apparent to those of ordinary skill in the art. It is therefore not intended that this invention be limited, except as indicated in the appended claims.

I claim:

1. In an integrated circuit MOS power device in a die having a back side and a top metal layer, the improvement comprising:
   cellular MOS active devices disposed in said die substantially throughout said power device for conducting current from said back side to said top metal layer through said cellular active devices, said top metal layer having substantially uniform resistivity and defining a source electrode for said active devices;
   at least a first current sense pad for a first current sense lead of said power device; and
   a source pad for a source lead of said power device including at least a first Kelvin pad portion for at least a first Kelvin sense lead;
   said first Kelvin pad portion being disposed at a first separation from said first current sense pad across said top metal layer such that a first resistive path is defined through said top metal layer between said first Kelvin pad and said first current sense pad such that voltages may be measured indicative of current flow in proportion to the total current in said power device.

2. The improvement according to claim 1 further including:
   a second current sense pad for a second sense lead;
   a second Kelvin pad portion of said source pad, said second Kelvin pad portion being disposed at a second separation from said second current sense pad across said top metal layer such that a second resistive path is defined through said top metal layer between said second Kelvin pad portion and said second current sense pad.

3. The improvement according to claim 2 wherein said first current sense pad and said second current sense pad are disposed equidistant from said source pad such that asymmetries in current between said first current sense pad and said second current sense pad can be sensed as a voltage difference to indicate asymmetries in current flow in said die.

4. The improvement according to claim 1 further including a gate pad on said die disposed at a distance from said source pad, wherein said gate pad has no cellular active devices associated therewith.

* * * * *